(12) United States Patent
Park et al.

(10) Patent No.: US 7,659,601 B2
(45) Date of Patent: Feb. 9, 2010

(54) SEMICONDUCTOR DEVICE HAVING MOISTURE-PROOF DAM AND METHOD OF FABRICATING THE SAME

(75) Inventors: Ji-Suk Park, Seoul (KR); Won-Chul Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 243 days.

(21) Appl. No.: 11/823,558

(22) Filed: Jun. 28, 2007

(65) Prior Publication Data

US 2008/0093704 A1    Apr. 24, 2008

(30) Foreign Application Priority Data

Oct. 20, 2006    (KR) .................... 10-2006-0102536

(51) Int. Cl.
*H01L 29/93* (2006.01)
(52) U.S. Cl. ............... 257/529; 257/E23.15; 438/132; 438/281
(58) Field of Classification Search ........ 257/529, 257/E23.15; 438/132, 281
See application file for complete search history.

(56) References Cited

U.S. PATENT DOCUMENTS

| | | | |
|---|---|---|---|
| 6,100,116 A | | 8/2000 | Lee et al. |
| 6,100,118 A | * | 8/2000 | Shih et al. ................. 438/132 |
| 6,162,686 A | * | 12/2000 | Huang et al. ............... 438/281 |
| 6,300,232 B1 | * | 10/2001 | Satoh ....................... 438/601 |
| 6,444,544 B1 | * | 9/2002 | Hu et al. .................... 438/467 |
| 6,521,971 B2 | * | 2/2003 | Tsai ........................ 257/529 |
| 6,867,441 B1 | * | 3/2005 | Yang et al. ................. 257/209 |
| 2005/0161766 A1 | * | 7/2005 | Sato et al. .................. 257/529 |

FOREIGN PATENT DOCUMENTS

| | | |
|---|---|---|
| KR | 100228774 B1 | 8/1999 |
| KR | 1020000045910 A | 7/2000 |
| KR | 1020010066336 A | 7/2001 |
| KR | 10-2003-0012975 A | 2/2003 |
| KR | 1020050000746 A | 1/2005 |
| KR | 1020050071046 A | 7/2005 |

OTHER PUBLICATIONS

Notice of Office Action, corresponding to Korean Patent Application No. 10-2006-0102536, issued by the Korean Patent Office on Sep. 27, 2007.

* cited by examiner

*Primary Examiner*—Wael Fahmy
*Assistant Examiner*—John C Ingham
(74) *Attorney, Agent, or Firm*—Myers Bigel Sibley & Sajovec, P.A.

(57) ABSTRACT

A semiconductor device having a moisture-proof dam and a method of fabricating the same are provided. The semiconductor device includes an interlayer insulating layer provided on a substrate having a fuse region. A fuse guard dam is provided on the interlayer insulating layer to surround the fuse region. A cover insulating layer is provided on the interlayer insulating layer to cover the fuse guard dam and have a fuse window exposing a middle part of the fuse region, and at least two upper extension dams are provided in the cover insulating layer to sequentially surround the fuse region and be connected to the fuse guard dam.

21 Claims, 11 Drawing Sheets

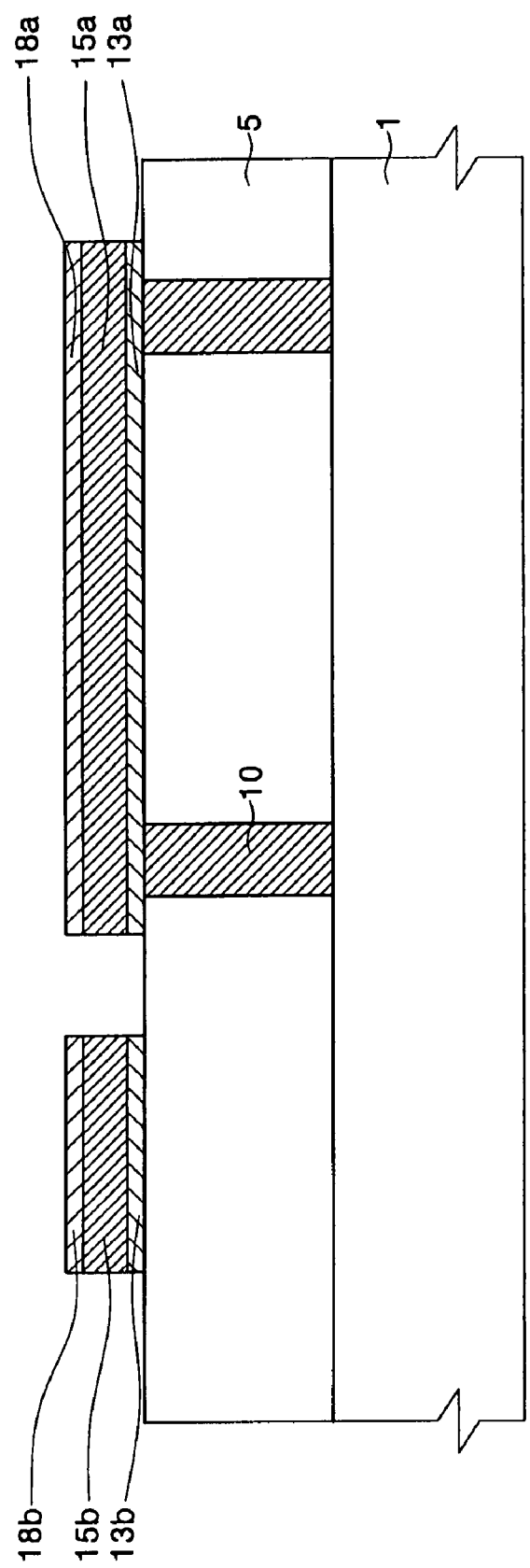

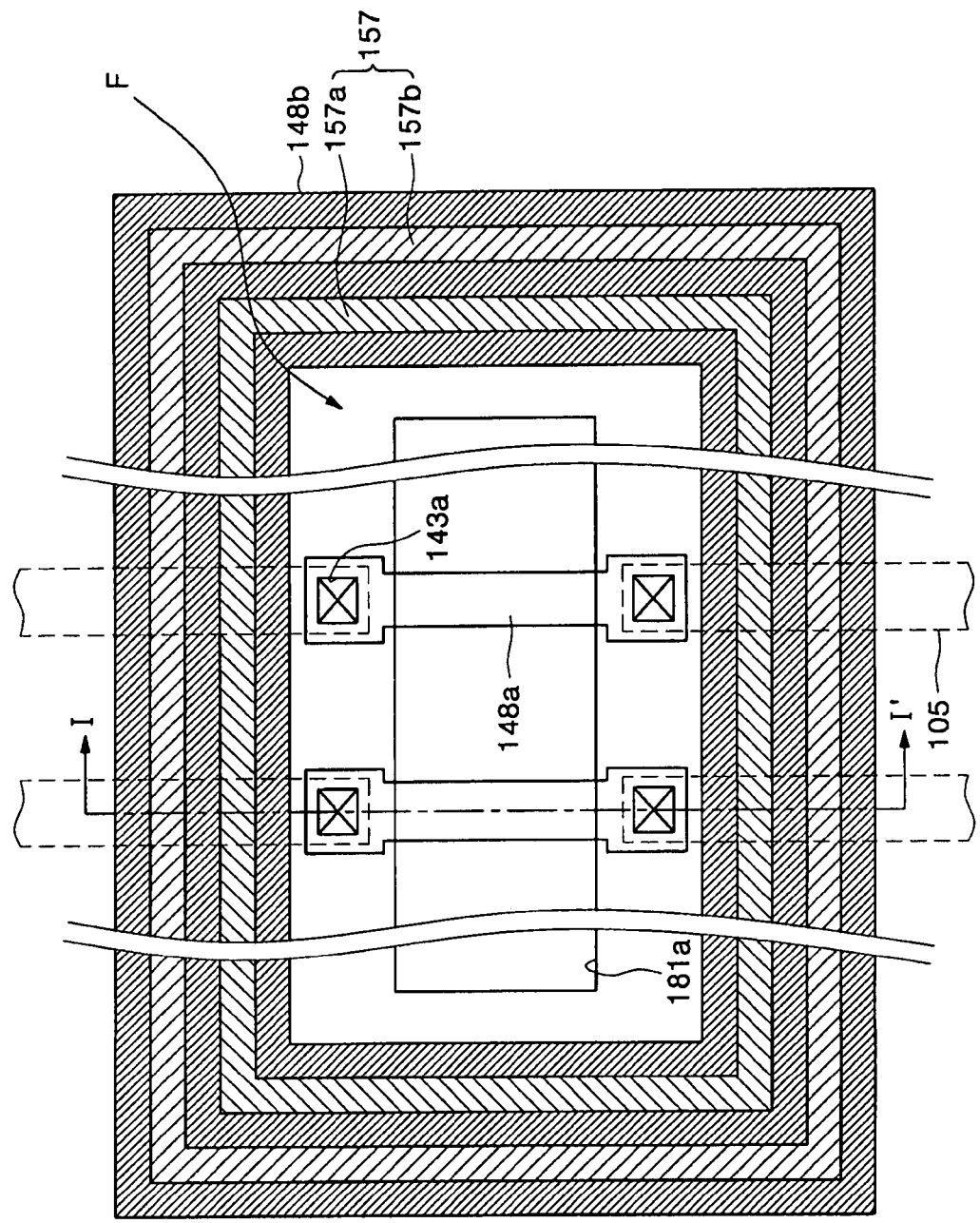

SEMICONDUCTOR DEVICE HAVING MOISTURE-PROOF DAM AND METHOD OF FABRICATING THE SAME

This application claims the benefit of Korean Patent Application No. 10-2006-0102536, filed on Oct. 20, 2006, the contents of which are hereby incorporated herein by reference in their entirety.

FIELD OF THE INVENTION

The invention relates generally to semiconductor devices and, more particularly, to methods of fabricating semiconductor devices.

BACKGROUND OF THE INVENTION

Generally, semiconductor devices have at least one fuse box. The fuse boxes serve to replace one or more failed cells that do not operate during a driving test of a semiconductor device with redundant cells. The replacement of failed cells with redundant cells is performed by disabling the failed cells through a repair process that cuts a fuse in the fuse box relative to the failed cells with laser beams and selecting the redundant cells. The repair process comprises irradiating laser beams to blow predetermined fuses such that the redundant cell has the address of the failed cell in write and read modes. The fuse box may comprise a fuse region in which the fuses are disposed and a guard region surrounding the fuse region. The guard region may have a moisture-proof dam for preventing penetration of moisture from the fuse region into the semiconductor device.

A method of fabricating a fuse is disclosed by Sato et al. in U.S. Patent Publication No. 2005/0161766 A1 entitled "Semiconductor Device and Method for Fabricating the Same."

FIGS. 1A to 1D are cross-sectional views illustrating a conventional method of fabricating a semiconductor device having a moisture-proof dam.

Referring to FIG. 1A, an interlayer insulating layer 5 may be formed on a semiconductor substrate 1. A fuse contact plug 10 passing through the interlayer insulating layer 5 may be formed. A barrier layer, a fuse metal layer and a capping layer are sequentially formed on the substrate having the fuse contact plug 10. The barrier layer may be a titanium nitride layer, the fuse metal layer may be an aluminum (Al) layer, and the capping layer may be formed by stacking titanium and titanium nitride layers. The capping layer, the fuse metal layer and the barrier layer are sequentially patterned, thereby forming a first barrier pattern 13a, a fuse 15a and a first capping pattern 18a which are sequentially stacked in a fuse region, and forming a second barrier pattern 13b, a fuse guard dam 15b and a second capping pattern 18b which are sequentially stacked around the fuse region.

Referring to FIG. 1B, an intermetal insulating layer 25 may be formed on the substrate having the first barrier pattern 13a, the fuse 15a and the first capping pattern 18a. The intermetal insulating layer 25 may be formed of boron phosphorus silicate glass (BPSG), phosphorus silicate glass (PSG), spin-on-glass (SOG), tetra ethyl ortho silicate (TEOS), or undoped silicate glass (USG). The BPSG, PSG, SOG, TEOS and USG layers have excellent step coverage, and strong moisture absorption.

A via dam 27 passing through the intermetal insulating layer 25 and contacting the second capping pattern 15b may be formed. The via dam 27 may be formed of an Al layer. Also, the via dam 27 may comprise a titanium nitride layer covering a bottom surface and sidewalls of the Al layer.

An upper guard dam 30 covering the via dam 27 may be formed on the intermetal insulating layer 25. The upper guard dam 30 may be formed of a titanium nitride layer, an aluminum layer, and a titanium and titanium nitride layer which are sequentially stacked. A protection insulating layer 35 may be formed on the substrate having the upper guard dam 30.

Referring to FIG. 1C, the protection insulating layer 35 and the intermetal insulating layer 25 are patterned to form a fuse window 36 exposing the fuse 15a. In general, the fuse window 36 may be formed to expose the middle part of the fuse 15a as illustrated in FIG. 1C. In result, during the formation of the fuse window 36, the first capping pattern 18a remains on both ends of the fuse 15a. Since the intermetal insulating layer 25 has strong moisture absorption, external moisture, for example, moisture in the air, may be introduced into an interface of the first capping pattern 18a from the outside along a path represented by arrow "A" through the fuse window 36.

Referring to FIG. 1D, the fuse 15a exposed through the fuse window 36 and the barrier pattern 13a under the fuse 15a may be cut by laser beams in the repair process.

When external moisture is introduced into the interface of the first capping pattern 18a from the outside through the fuse window 36, the first capping pattern 18a formed of a titanium and titanium nitride layer may expand as a result of the moisture. For example, the moisture may expand due to high temperatures during semiconductor manufacturing or during testing. In addition, oxygen in the moisture may react with titanium included in the first capping pattern 18a, which may result in the expansion of the first capping pattern 18a. As a result, an expanded capping pattern 18c may be formed as illustrated in FIG. 1D.

Accordingly, the expanded capping pattern 18c may apply more stress to the intermetal insulating layer 25 disposed thereon. For this reason, a crack C may occur in the intermetal insulating layer 25 adjacent to the expanded capping pattern 18c, and may extend to the via dam 27 adjacent to the upper guard dam 30. The crack C may extend to the interface between the via dam 27 and the upper guard dam 30.

The crack C may serve as an inflow path of moisture or contaminated materials, which may lead to corrosion of interconnections and increase in leakage current. As such, the moisture or contaminated materials introduced through the crack C may cause malfunction of the semiconductor device.

SUMMARY OF THE INVENTION

An embodiment of the invention provides a semiconductor device having a moisture-proof dam that effectively prevents penetration of moisture or contaminated materials through cracks.

Another embodiment of the invention provides a method of fabricating a semiconductor device having a moisture-proof dam that effectively prevents penetration of moisture or contaminated materials through cracks.

In one embodiment, a semiconductor device having a moisture-proof dam is provided. The device comprises an interlayer insulating layer provided on a substrate having a fuse region. A fuse guard dam is provided on the interlayer insulating layer to surround the fuse region. A cover insulating layer is provided on the interlayer insulating layer to cover the fuse guard dam and so as to have a fuse window opening in a middle part of the fuse region. At least two upper extension dams sequentially surrounding the fuse region and connected to the fuse guard dam are provided in the cover insulating layer.

In some embodiments of the present invention, the device may further comprise at least one upper guard dam disposed in the cover insulating layer and provided on the upper extension dams.

The upper guard dam may have an inner sidewall closer to a center part of the fuse region than the fuse guard dam.

When a plurality of upper guard dams are provided, the upper guard dams may cover the upper extension dams, respectively.

When a plurality of upper guard dams are provided, the upper guard dams may be disposed at different levels. Furthermore, a semiconductor device may further comprise at least one via guard dam interposed between the upper guard dams.

In other embodiments, a semiconductor device may further comprise at least one lower extension dam connected to the fuse guard dam, sequentially surrounding the fuse region, and provided in the interlayer insulating layer.

A semiconductor device may further comprise at least one lower guard dam provided under the lower extension dam.

When a plurality of lower guard dams are provided, the lower guard dams may be disposed at different levels. Furthermore, a semiconductor device may further comprise at least one plug guard dam interposed between the lower guard dams.

In still other embodiments, a semiconductor device may further comprise a passivation layer covering a top surface of the cover insulating layer and a sidewall of the fuse window.

In yet other embodiments, the upper extension dams may comprise a metallic element.

In yet other embodiments, the upper extension dams may comprise at least one of aluminum (Al), tungsten (W) and copper (Cu) elements.

In yet other embodiments, the device may further comprise a barrier pattern provided under the fuse guard dam, and a capping pattern provided over the fuse guard dam.

In another aspect, a method of fabricating a semiconductor device having a moisture-proof dam is provided. The method comprises forming lower and upper interlayer insulating layers which are sequentially stacked on a substrate having a fuse region. A fuse guard dam surrounding the fuse region is formed on the upper interlayer insulating layer. An intermetal insulating layer is formed on the substrate having the fuse guard dam. At least two upper extension dams are formed to pass through the intermetal insulating layer, be connected with the fuse guard dam, and sequentially surround the fuse region. A protection insulating layer is formed on the substrate having the upper extension dams. The protection insulating layer and the intermetal insulating layer are sequentially patterned to form a fuse window exposing a middle part of the fuse region.

In some embodiments of the present invention, before forming the protection insulating layer, at least one first upper guard dam may be formed on the intermetal insulating layer to cover the upper extension dams and surround the fuse region.

After forming the first upper guard dam, additional steps may further comprise: forming an upper intermetal insulating layer on the substrate having the first upper guard dams; forming at least one via guard dam passing through the upper intermetal insulating layer and connected to the first upper guard dam, the via guard dam being formed to surround the fuse region; and forming a second upper guard dam on the upper intermetal insulating layer to cover the via guard dam and surround the fuse region.

The first upper guard dam may be formed to have an inner sidewall closer to the center of the fuse region than the fuse guard dam.

When a plurality of first upper guard dams are provided, the first upper guard dams may be formed to cover the upper extension dams, respectively.

In other embodiments, after forming the upper interlayer insulating layer, at least one lower extension dam may be formed that pass through the upper interlayer insulating layer and surrounds the fuse region.

After forming the lower interlayer insulating layer, a first lower guard dam may be formed on the lower interlayer insulating layer to surround the fuse region.

After forming the first lower guard dam, additional steps may include: Forming an intermediate interlayer insulating layer on the substrate having the first lower guard dam; forming at least one plug guard dam passing through the intermediate interlayer insulating layer and contacting the first lower guard dam, the plug guard dam being formed to surround the fuse region; and forming a second lower guard dam on the intermediate interlayer insulating layer to cover the lower plug guard dam.

In still other embodiments, the formation of the fuse guard dam may comprise forming a fuse metal layer on the upper interlayer insulating layer; and patterning the fuse metal layer.

Before forming the fuse metal layer, a barrier layer may be formed on the upper interlayer insulating layer, wherein the barrier layer is patterned by a semiconductor process of patterning the fuse metal layer, and thus left under the fuse guard dam.

After forming the fuse metal layer, t a capping layer may be formed on the fuse metal layer, wherein the capping layer is patterned by the semiconductor process of patterning the fuse metal layer and thus left over the fuse guard dam.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

FIGS. 1A to 1D are cross-sectional views illustrating a conventional method of fabricating a semiconductor device having a moisture-proof dam.

FIG. 2 is a plan view of a semiconductor device having a moisture-proof dam according to an exemplary embodiment of the present invention.

DETAILED DESCRIPTION OF THE INVENTION

Figure 1B:
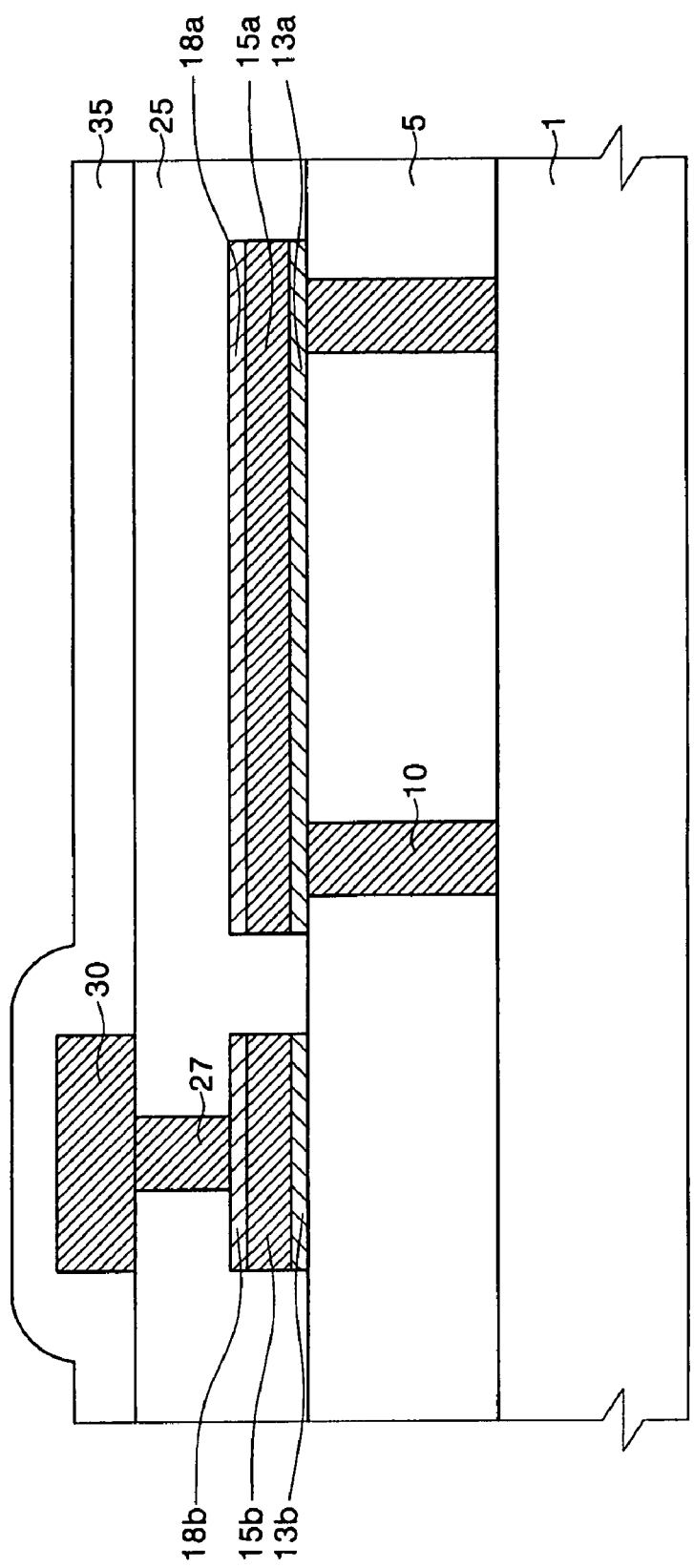
Figure 1C:
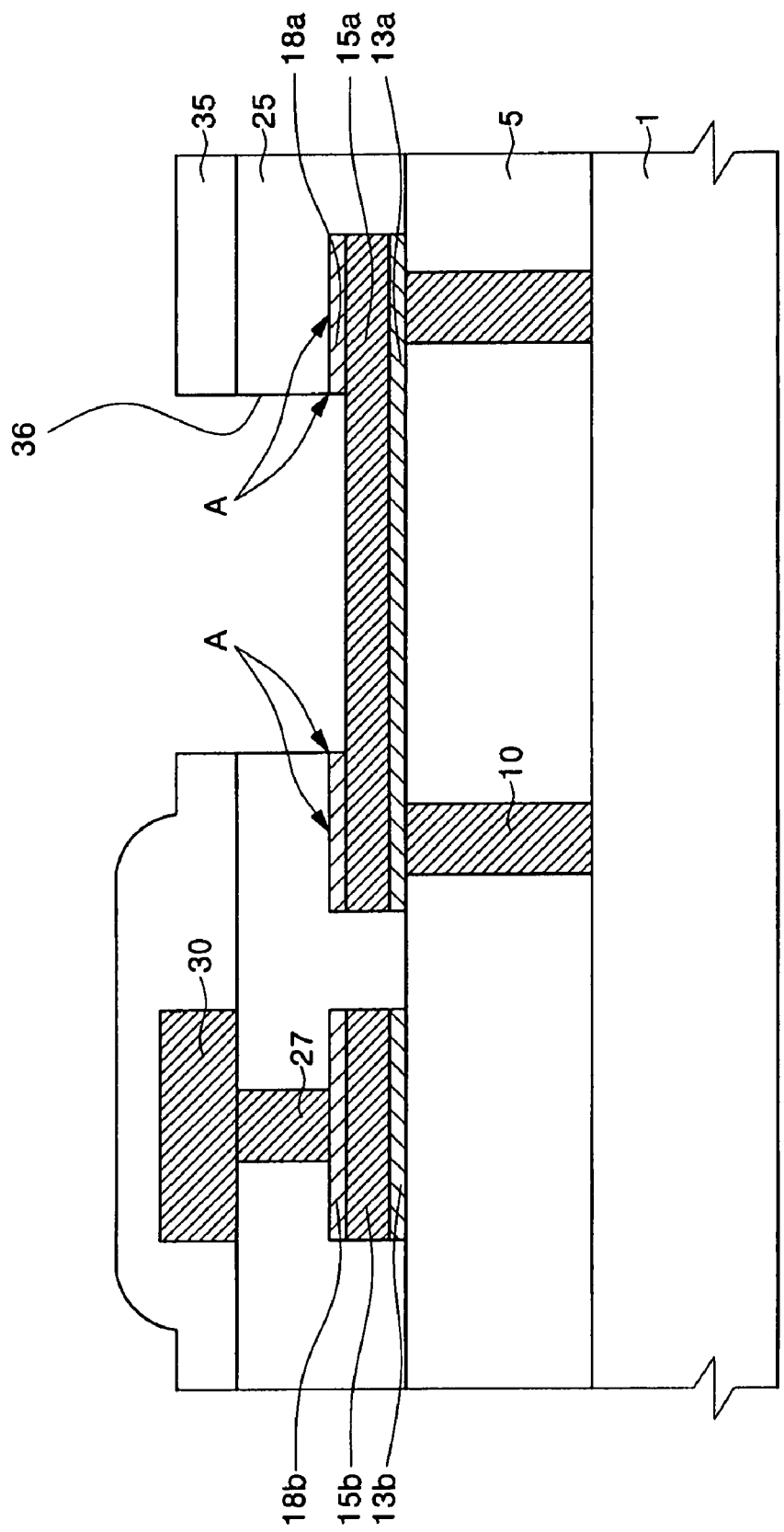
Figure 1D:
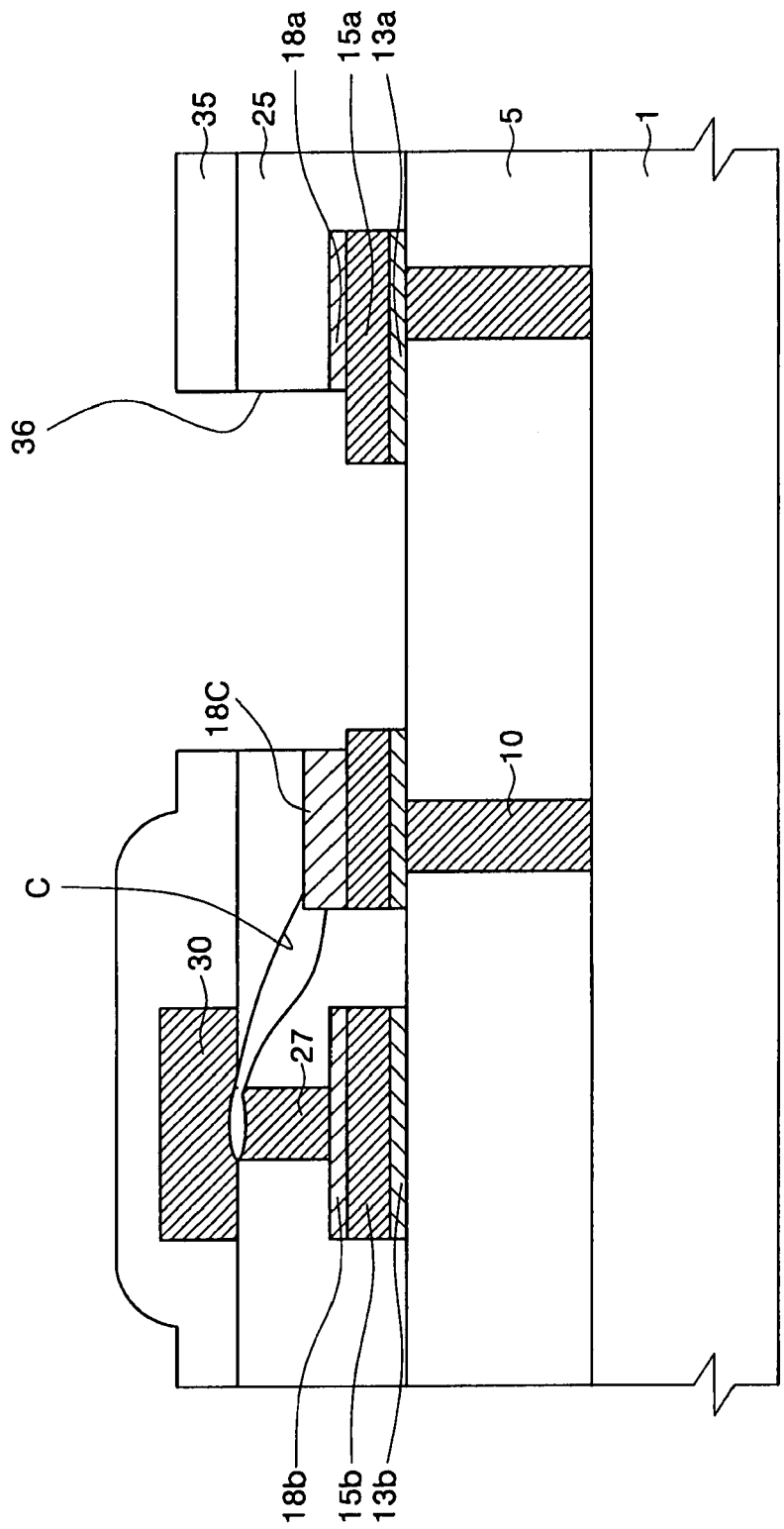

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly. Moreover, the term "beneath" indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to plan and cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
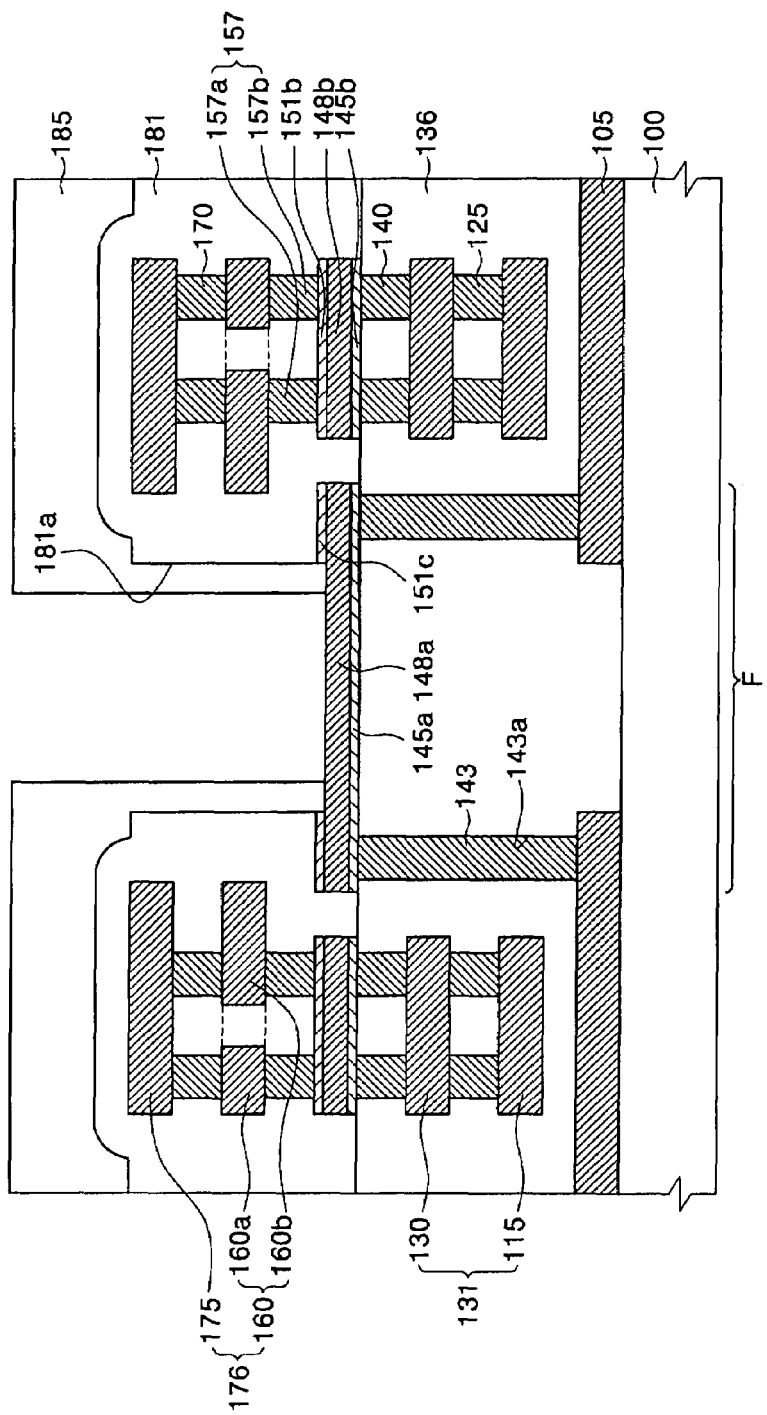
FIG. 3 is a cross-sectional view of a semiconductor device having a moisture-proof dam according to an exemplary embodiment of the present invention.

FIG. 2 is a plan view of a semiconductor device having a moisture-proof dam according to an exemplary embodiment of the present invention, FIG. 3 is a cross-sectional view taken along line I-I' of FIG. 2 illustrating a semiconductor device having a moisture-proof dam, and FIGS. 4 to 8 are cross-sectional views taken along line I-I' of FIG. 2 illustrating a method of fabricating a semiconductor device having a moisture-proof dam. Throughout FIGS. 2 to 8, a part represented by reference mark "F" is a fuse region.

A semiconductor device having a moisture-proof dam will be first described with reference to FIGS. 2 and 3.

Referring to FIGS. 2 and 3, lower interconnections 105 may be provided on a substrate 100 having a fuse region F. The surface of the substrate 100 may be insulated. Here, a device such as a transistor may be provided in the substrate 100, which is not illustrated in the drawings. The fuse region F may be defined as a region in which fuses are formed. An interlayer insulating layer 136 may be provided on the substrate having the lower interconnections 105. The interlayer insulating layer 136 may include a silicon oxide layer.

Meanwhile, the surface of the interlayer insulating layer 136 may be formed of an insulating and moisture-resistant material. For example, the interlayer insulating layer 136 may include a silicon oxide layer and a silicon nitride layer which are sequentially stacked. That is, the surface of the interlayer insulating layer 136 may be formed of a silicon nitride layer.

A fuse guard dam 148*b* surrounding the fuse region F is provided on the interlayer insulating layer 136. The fuse guard dam 145*b* may include a metallic element. For example, the fuse guard dam 148*b* may include at least one of aluminum (Al), tungsten (W), and/or copper (Cu) elements, or various combinations thereof. More specifically, the fuse guard dam 148*b* may include aluminum (Al) layer, tungsten (W) layer, copper (Cu) layer, and/or Al—Cu alloy layer, or various combinations thereof.

A second barrier pattern 145*b* interposed between the interlayer insulating layer 136 and the fuse guard dam 148*b* may be provided. The second barrier pattern 145*b* may include a metallic element or a nitrogen element. For example, the second barrier pattern 145*b* may include at least one of titanium (Ti) and tantalum (Ta) elements, and a nitrogen element.

More specifically, the second barrier pattern 145*b* may include a titanium nitride (TiN) layer and/or a tantalum nitride (TaN) layer.

A second capping pattern 151*b* may be provided on the fuse guard dam 148*b*. The second capping pattern 151*b* may include a metallic element and a nitrogen element. For example, the second capping pattern 151*b* may include at least one of Ti and Ta elements, and a nitrogen element. More specifically, the second capping pattern 151*b* may include a titanium nitride (TiN) layer and/or a tantalum nitride (TaN) layer.

At least one fuse 148*a* may be provided over the interlayer insulating layer 136 and thus disposed in the fuse region F. The fuse 148*a* may be disposed at the same level as the fuse guard dam 148*b*. The fuse 148*a* and the fuse guard dam 148*b* may be formed of the same material.

A first barrier pattern 145*a* may be interposed between the interlayer insulating layer 136 and the fuse 148*a*. The first barrier pattern 145*a* may be formed of the same material as the second barrier pattern 145*b*. A remaining capping pattern 151*c* may be provided on the fuse 148*a*. The remaining capping pattern 151*c* may entirely or partially cover the top surface of the fuse 148*a*. The remaining capping pattern 151*c* may be provided to cover both ends of the fuse 148*a*. The remaining capping pattern 151*c* may be formed of the same material as the second capping pattern 151*b*.

At least one lower extension dam 140 extending from the fuse guard dam 148*b* into the interlayer insulating layer 136, and surrounding the fuse region F may be provided. When a plurality of lower extension dams 140 are provided, the lower extension dams 140 may be disposed to sequentially surround the fuse region F. The lower extension dam 140 may include W, Al and/or Cu elements, or various combinations thereof.

At least one lower guard dam 131 may be provided in the interlayer insulating layer 136 and under the lower extension dam 140. The lower guard dam 131 may include W, Al, Cu, silicon (Si) and/or Ti elements, or various combinations thereof.

The lower guard dam 131 may be disposed to surround the fuse region F. When a plurality of lower guard dams 131 are provided, the lower guard dams 131 may be disposed at different levels from each other, and connected to each other by at least one plug guard dam surrounding the fuse region F. More specifically, the lower guard dams 131 may include at least one second lower guard dam 130 and a first lower guard dam 115 provided under the second lower guard dam 130. When a plurality of second lower guard dams 130 are provided, a plurality of lower extension dams 140 may also be provided.

At least one plug guard dam 125 may be provided between the second lower guard dam 130 and the first lower guard dam 115. The plug guard dam 125 may include W, Al and/or Cu elements, or various combinations thereof.

Fuse contact plugs 143 may be provided, which pass through the interlayer insulating layer 136, and electrically connect both ends of the fuse 148*a* to the lower interconnections 105. The fuse contact plugs 143 may include W, Al and/or Cu elements, or various combinations thereof.

A cover insulating layer 181 may be provided on the interlayer insulating layer 136 to cover the fuse guard dam 148*b* and to form a fuse window 181*a* exposing the middle part of the fuse region F. That is, the cover insulating layer 181 may cover both ends of the fuse 148*a* in the fuse region F. The remaining capping patterns 151*c* disposed on both ends of the fuse 148*a* may also be covered by the cover insulating layer 181. The upper region of the cover insulating layer 181 may be formed of an insulating and moisture-resistant material layer, for example, a silicon nitride layer. The cover insulating layer 181 may include a silicon oxide layer and a silicon nitride layer which are sequentially stacked.

At least two upper extension dams 157 are provided in the cover insulating layer 181 to surround the fuse region F, and connected to the fuse guard dam 148*b*. The upper extension dams 157 may be composed of a first upper extension dam 157*a* and a second upper extension dam 157*b*, as illustrated. The upper extension dams 157 may include a metallic element. For example, the upper extension dams 157 may include W, Al and/or Cu elements, or combinations thereof.

At least one upper guard dam 176 may be provided in the cover insulating layer 181 and on the upper extension dams 157. The upper guard dam 176 may be disposed to surround the fuse region F. When a plurality of upper guard dams 176 are provided, the upper guard dams 176 may be disposed at different levels, and connected to each other by at least one via guard dam surrounding the fuse region F. More specifically, the upper guard dams 176 may include at least one first upper guard dam 160 and a second upper guard dam 175 provided on the first upper guard dam 160. The second upper guard dam 175 may overlap the first upper guard dam 160.

The first upper guard dam 160 may be wider than the fuse guard dam 148*b*. More specifically, the first upper guard dam 160 may be closer to the fuse window 181*a* than the fuse guard dam 148*b*. In other words, the first guard dam 160 may have an inner sidewall which is closer to the center of the fuse region F than the fuse guard dam 148*b*. Such a first guard dam 160 may effectively prevent penetration of moisture into the semiconductor device from the outside.

When a plurality of first upper guard dams 160 are provided, the first upper guard dams 160 may cover the upper extension dams 157, respectively. The first upper guard dam 160 may be composed of an inner first upper guard dam 160*a* and an outer first upper guard dam 160*b*. Here, the inner first upper guard dam 160*a* may be closer to the fuse window 181*a* than the fuse guard dam 148*b*. That is, the inner first upper guard dam 160*a* may have an inner sidewall closer to the center of the fuse region F than the fuse guard dam 148*b*.

At least one via guard dam 170 may be provided between the second upper guard dam 175 and the first upper guard dam 160. When a plurality of first upper guard dams 160 are provided, the same number of via guard dams 170 as the first upper guard dams 160 may also be provided, which may be interposed between the second upper guard dam 175 and the first upper guard dam 160. The second upper guard dam 175 may include W, Al and/or Cu elements, or combinations thereof. The via guard dam 170 may include W, Al and/or Cu elements, or combinations thereof.

The moisture-proof structure such as the via guard dam 170 and the second upper guard dam 175 may be repeatedly provided on the second upper guard dam 175 in the cover insulating layer 181, which is not illustrated in this drawing.

A passivation layer 185 covering a top surface of the cover insulating layer 181 and a sidewall of the fuse window 181*a* may be provided, as illustrated. The passivation layer 185 may cover the sidewall of the remaining capping pattern 151*c* disposed on both ends of the fuse 148*a* as well as the sidewall of the fuse window 181*a*. The passivation layer 185 may be formed of an insulating material capable of preventing penetration of moisture into the semiconductor device from the outside. For example, the passivation layer 185 may include a polyimide layer.

Consequently, a moisture-proof dam including the lower guard dam 131, the fuse guard dam 148*b*, the upper guard dam 176, the plug guard dam 125, the lower extension dam 140, the upper extension dams 157 and the via guard dam 170 may be provided. Furthermore, the passivation layer 185 may cover the sidewall of the fuse window 181*a*, and thus prevent penetration of moisture through the sidewall of the fuse window 181*a* into the semiconductor device from the outside.

If a failed cell is generated and thus the fuse 148*a* is cut, moisture is introduced into both ends of the fuse 148*a* from the outside through the cut surface of the fuse 148*a*, the remaining capping patterns 151*c* or both ends of the fuse 145*a* are expanded by a subsequent thermal process, and thus stress may be applied to the cover insulating layer 181. However, since the present invention has the upper extension dams 157 sequentially surrounding the fuse region F, the stress applied to the cover insulating layer 181 may be relieved in the first upper extension dam 157*a* which is closest to the fuse region F among the upper extension dams 157. In other words, even if there is a crack in the first upper extension dam 157*a*, the second upper extension dam 157*b* may still serve to prevent moisture penetration. As a result, the moisture-proof dam according to the present invention may effectively prevent moisture and contaminated materials from being introduced through the crack into the semiconductor device from the outside. Furthermore, the surfaces of the cover insulating layer 181 and the interlayer insulating layer 136 are formed of a moisture-resistant material, and thus can effectively prevent the path where the moisture is introduced into the semiconductor device from the outside. Even if moisture penetrates through the surface of the interlayer insulating layer 136 from the outside, since the moisture-proof dams such as the lower extension dam 140, the lower guard dam 131 and the plug guard dam 125 are disposed under the fuse guard dam 148*b*, it is possible to prevent the moisture from penetrating into the semiconductor device from the outside. Therefore, reliability of the semiconductor device may be improved.

Next, a method of fabricating a semiconductor device having a moisture-proof dam according to an exemplary embodiment of the present invention will be described with reference to FIGS. 2, and 4 to 8.

Figure 4:
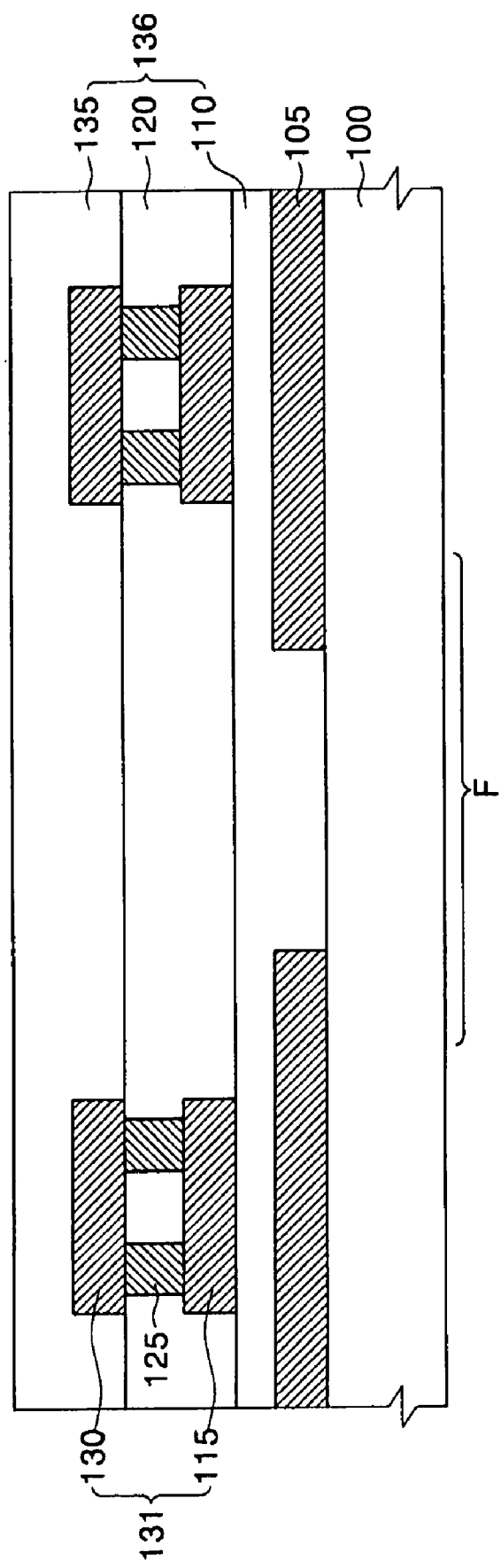
FIGS. 4 to 8 are cross-sectional views illustrating a method of fabricating a semiconductor device having a moisture-proof dam according to an exemplary embodiment of the present invention.

Referring to FIGS. 2 and 4, a substrate 100 having a fuse region F is prepared. The substrate 100 may include a device such as a transistor, and its surface may be insulated. Lower interconnections 105 may be formed on the substrate 100. The lower interconnections 105 may partially overlap the fuse region F.

A lower interlayer insulating layer 110 may be formed on the substrate having the lower interconnections 105. The lower interlayer insulating layer 110 may include a silicon oxide layer.

A first lower guard dam 115 surrounding the fuse region F may be formed on the lower interlayer insulating layer 110. The first lower guard dam 115 may include W, Al, Cu, Si and/or Ti elements, or combinations thereof.

An intermediate interlayer insulating layer 120 may be formed on the substrate having the first lower guard dam 115. The intermediate interlayer insulating layer 120 may be formed of a silicon oxide layer. At least one plug guard dam 125 may be formed to pass through the intermediate interlayer insulating layer 120, contact the first lower guard dam 115, and surround the fuse region F. The plug guard dam 125 may include W, Al and/or Cu elements, or combinations thereof.

A second lower guard dam 130 may be formed on the intermediate interlayer insulating layer 120 to cover the plug guard dam 125 and surround the fuse region F. The second lower guard dam 130 may include W, Al and/or Cu elements, or combinations thereof. The second lower guard dam 130 and the first lower guard dam 115 may constitute a lower guard dam 131.

An upper interlayer insulating layer 135 may be formed on the substrate having the second lower guard dam 130. The upper interlayer insulating layer 135 may include an insulating and moisture-resistant material. For example, the upper interlayer insulating layer 135 may include a silicon nitride layer resistant to moisture. More specifically, the upper interlayer insulating layer 135 may include a silicon oxide layer and a silicon nitride layer. The upper interlayer insulating layer 135, the intermediate interlayer insulating layer 120 and the lower interlayer insulating layer 110 may constitute an interlayer insulating layer 136.

Figure 5:
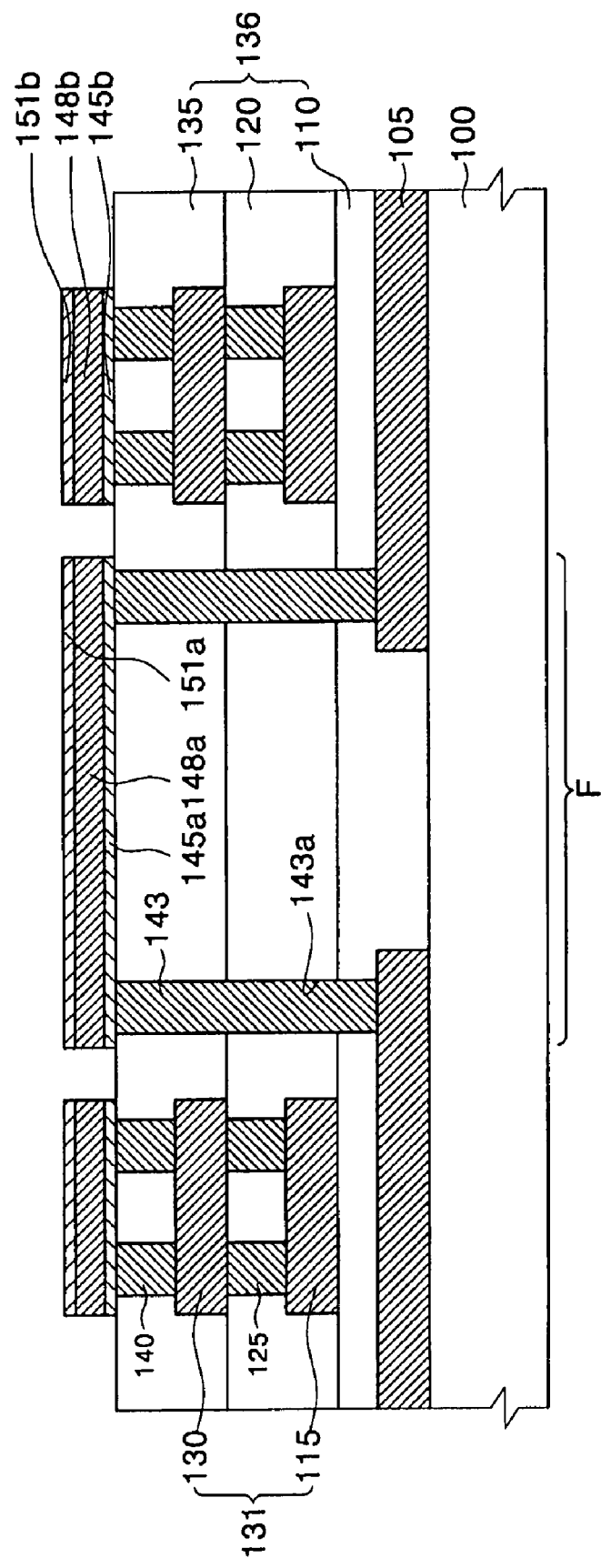

Referring to FIGS. 2 and 5, at least one lower extension dam 140 passing through the upper interlayer insulating layer 135 and contacting the second lower guard dam 130 may be formed. The lower extension dam 140 may include W, Al and/or Cu elements, or combinations thereof.

During the formation of the lower extension dam 140, plug contact holes 143*a* passing through the interlayer insulating layer 136 and exposing the lower interconnections 105 may be formed, and fuse contact plugs 143 filling the plug contact holes 143*a* may be formed. The fuse contact plugs 143 may include W, Al and/or Cu elements, or combinations thereof.

A barrier layer, a fuse conductive layer and a capping layer may be sequentially stacked on the upper interlayer insulating layer 135. The fuse conductive layer may include a metallic element. For example, the fuse conductive layer may include Al, W and/or Cu elements, or combinations thereof. More specifically, the fuse conductive layer may include an Al layer, a W layer, a Cu layer and/or an Al—Cu alloy layer, or combinations thereof.

The barrier layer may prevent diffusion of the metallic element in the fuse conductive layer into the interlayer insulating layer 136 during the formation of the fuse conductive layer, or prevent partial penetration of the fuse conductive layer into the interlayer insulating layer 136 by a subsequent thermal process. The barrier layer may include a metallic element and a nitrogen element. For example, the barrier layer may include Ti and/or Ta elements, and a nitrogen element. More specifically, the barrier layer may at least include a TiN layer and/or a TaN layer.

The capping layer may serve as an anti-reflection layer. The capping layer may include a metallic layer and a nitrogen element. For example, the capping layer may include Ti and/or Ta elements, and a nitrogen element. More specifically, the capping layer may at least include a TiN layer and/or a TaN layer.

The capping layer, the fuse conductive layer and the barrier layer may be sequentially patterned to form a first barrier pattern 145*a*, a fuse 148*a* and a first capping pattern 151*a* which are sequentially stacked in the fuse region F, and form a second barrier pattern 145*b*, a fuse guard dam 148*b* and a second capping pattern 151*b* which surround the fuse region F and are sequentially stacked.

Figure 6:
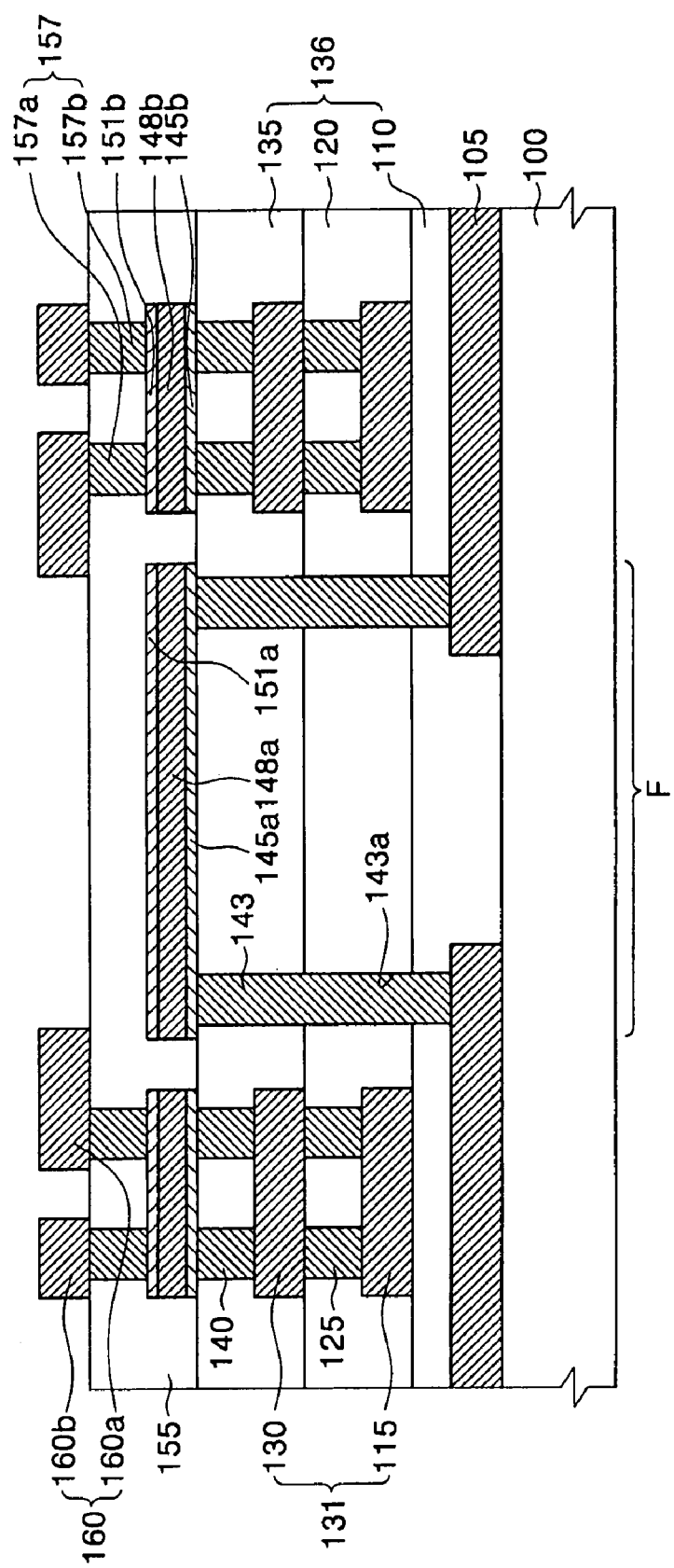

Referring to FIGS. 2 and 6, a lower intermetal insulating layer 155 may be formed on the substrate having the second barrier pattern 145*b*, the fuse guard dam 148*b* and the second capping pattern 151*b* which are sequentially stacked. The lower intermetal insulating layer 155 may include a silicon oxide layer. At least two first upper extension dams 157 passing through the lower intermetal insulating layer 155, connected to the fuse guard dam 148*b*, and sequentially surrounding the fuse region F may be provided. The first upper extension dams 157 may include an inner first upper extension dam 157*a* and an outer first upper extension dam 157*b*. The first upper extension dams 157 may include Al, W and/or Cu elements, or combinations thereof.

At least one first upper guard dam 160 covering the first upper extension dams 157 and surrounding the fuse region F may be formed on the lower intermetal insulating layer 155. The first upper guard dam 160 may be wider than the fuse guard dam 148b. In this case, the first upper guard dam 160 may be formed to partially overlap the fuse region F and surround the fuse region F. Accordingly, the first upper guard dam 160 may be formed to have an inner sidewall closer to the center of the fuse region F than the fuse guard dam 148b.

When a plurality of first upper guard dams 160 are provided, the first upper guard dams 160 may be formed to cover the first upper extension dams 157, respectively. For example, the first upper guard dam 160 may include an inner first upper guard dam 160a and an outer first upper guard dam 160b. The inner first upper guard dam 160a may be formed to cover the inner first upper extension dam 157a, and the outer first upper guard dam 160b may be formed to cover the outer first upper extension dam 157b. The inner first upper guard dam 160b may be formed to have an inner sidewall closer to the fuse region F than the fuse guard dam 148b. The first upper guard dam 160 may include Al, W and/or Cu elements, or combinations thereof.

The first upper guard dam 160 and the first upper extension dams 157 may be formed by the same process. For example, the first upper guard dam 160 and the first upper extension dams 157 may be formed by patterning the lower intermetal insulating layer 155 to form via holes exposing the fuse guard dam 148b or the second capping pattern 151b, forming a metal layer filling the via holes and covering the lower intermetal insulating layer 155, and patterning the metal layer. Alternatively, the first upper guard dam 160 and the first upper extension dams 157 may be formed by a damascene process comprising: patterning the lower intermetal insulating layer 155 to form via holes exposing the fuse guard dam 148b or the second capping pattern 151b, and trenches overlapping the via holes; and forming a metal layer filling the trenches and via holes.

Figure 7:
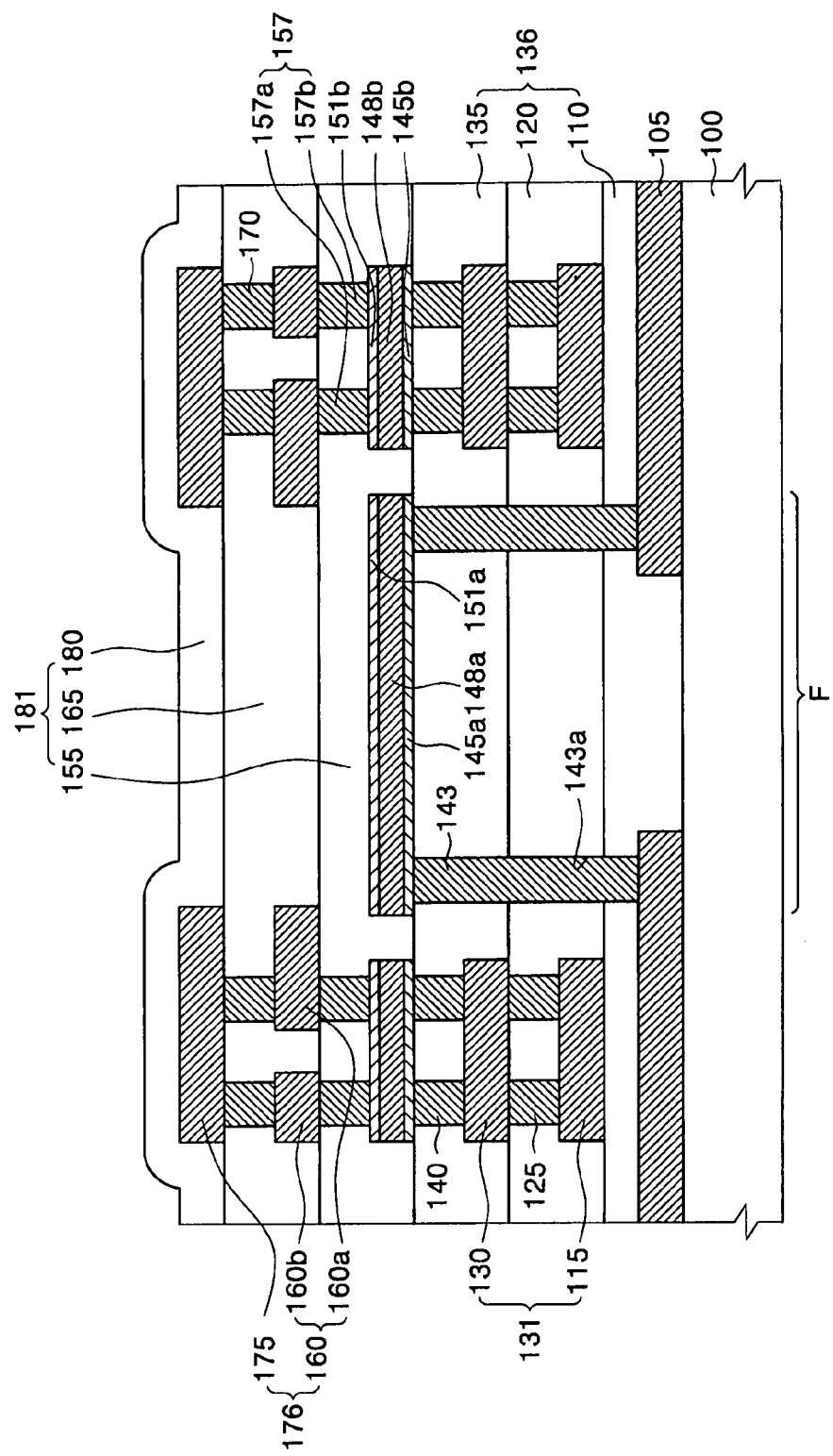

Referring to FIGS. 2 and 7, an upper intermetal insulating layer 165 may be formed on the substrate having the first upper guard dam 160. The upper intermetal insulating layer 165 may include a silicon oxide layer. At least one via guard dam 170 passing through the upper intermetal insulating layer 165 and contacting the first upper guard dam 160 may be formed. The via guard dam 170 may include Al, W and/or Cu elements, or combinations thereof.

A second upper guard dam 175 covering the via guard dam 170 may be formed on the upper intermetal insulating layer 165. The second upper guard dam 175 may include at least one of Al, W and Cu elements. The second upper guard dam 175 and the first upper guard dam 160 may constitute an upper guard dam 176.

A protection insulating layer 180 may be formed on the substrate having the second upper guard dam 175. The protection insulating layer 180 may be formed of a moisture-resistant material. For example, the protection insulating layer 180 may be a silicon nitride layer.

The protection insulating layer 180, the upper intermetal insulating layer 165 and the lower intermetal insulating layer 155 may constitute a cover insulating layer 181.

Figure 8:
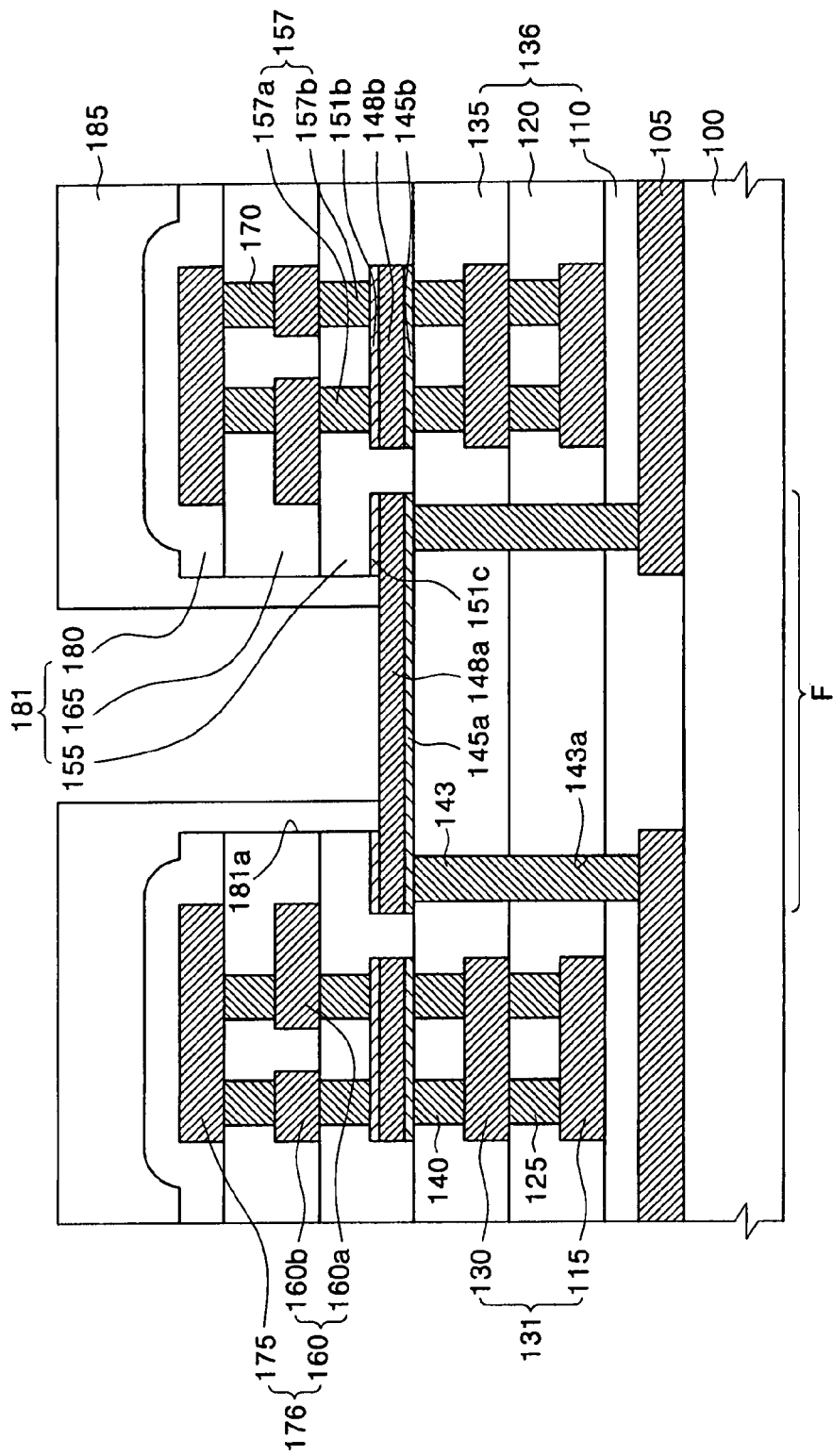

Referring to FIGS. 2 and 8, the cover insulating layer 181 may be patterned to form a fuse window 181a exposing the fuse 148a disposed in the middle of the fuse region F. As a result, the second capping pattern (151b in FIG. 7) may remain on both ends of the fuse 148a to form a remaining capping pattern 151c, which may be covered by the cover insulating layer 181.

A passivation layer 185 covering the top surface of the cover insulating layer 181 and the sidewall of the fuse window 181a may be formed. The passivation layer 185 may be formed of a moisture-resistant material, for example, a polyimide layer.

According to exemplary embodiments of the present invention described above, a fuse guard dam surrounding a fuse region is provided, and at least two upper extension guard dams sequentially surrounding the fuse region on the fuse guard dam and connected to the fuse guard dam are provided. The upper extension dams prevent the penetration of moisture and contaminated materials through a crack into a semiconductor device from the outside.

At least one upper guard dam provided on the upper extension dams has an inner sidewall closer to the center of the fuse region than the fuse guard dam, and thus the penetration of moisture into the semiconductor device from the outside may be effective prevented. Also, a passivation layer covering a sidewall of a fuse window can prevent moisture from penetrating though the sidewall of the fuse window into the semiconductor device from the outside.

Exemplary embodiments of the invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A semiconductor device comprising:
   an interlayer insulating layer provided on a substrate having a fuse region;
   a fuse guard dam provided on the interlayer insulating layer to surround the fuse region;
   a cover insulating layer provided on the interlayer insulating layer to cover the fuse guard dam, and having a fuse window opening in the fuse region;
   at least two upper extension dams sequentially surrounding the fuse region, connected to the fuse guard dam, and provided in the cover insulating layer; and
   at least one upper guard dam disposed in the cover insulating layer and provided on the upper extension dams, wherein the at least one upper guard dam has an inner sidewall closer to a center part of the fuse region than the fuse guard dam.

2. The semiconductor device according to claim 1, wherein a plurality of upper guard dams are provided, the upper guard dams cover the upper extension dams, respectively.

3. The semiconductor device according to claim 1, wherein a plurality of upper guard dams are provided, the upper guard dams are disposed at different levels.

4. The semiconductor device according to claim 3, further comprising at least one via guard dam interposed between the upper guard dams.

5. The semiconductor device according to claim 1, further comprising at least one lower extension dam connected to the fuse guard dam, sequentially surrounding the fuse region, and provided in the interlayer insulating layer.

6. The semiconductor device according to claim 5, further comprising at least one lower guard dam provided under the lower extension dam.

7. The semiconductor device according to claim 6, wherein a plurality of lower guard dams are provided, the lower guard dams are disposed at different levels.

8. The semiconductor device according to claim 7, further comprising at least one plug guard dam interposed between the lower guard dams.

9. The semiconductor device according to claim 1, further comprising a passivation layer covering a top surface of the cover insulating layer and a sidewall of the fuse window.

10. The semiconductor device according to claim 1, wherein the upper extension dams comprise a metallic element.

11. The semiconductor device according to claim 1, wherein the upper extension dams comprise at least one of aluminum (Al), tungsten (W) and copper (Cu) elements.

12. The semiconductor device according to claim 1, further comprising:
a barrier pattern provided under the fuse guard dam; and
a capping pattern provided over the fuse guard dam.

13. A method of fabricating a semiconductor device, comprising:
forming lower and upper interlayer insulating layers sequentially stacked on a substrate having a fuse region;
forming a fuse guard dam surrounding the fuse region on the upper interlayer insulating layer;
forming an intermetal insulating layer on the substrate having the fuse guard dam;
forming at least two upper extension dams passing through the intermetal insulating layer, connected to the fuse guard dam, and sequentially surrounding the fuse region;
forming at least one first upper guard dam on the intermetal insulating layer to cover the upper extension dams and surround the fuse region, wherein the at least one first upper guard dam is formed to have an inner sidewall closer to a center part of the fuse region than the fuse guard dam;
forming a protection insulating layer on the substrate having the upper extension dams; and
sequentially patterning the protection insulating layer and the intermetal insulating layer to form a fuse window exposing a portion of the fuse region.

14. The method according to claim 13, further comprising:
after forming the first upper guard dam,
forming an upper intermetal insulating layer on the substrate having the first upper guard dams;
forming at least one via guard dam passing through the upper intermetal insulating layer and connected to the first upper guard dam, the via guard dam being formed to surround the fuse region; and
forming a second upper guard dam on the upper intermetal insulating layer to cover the via guard dam and surround the fuse region.

15. The method according to claim 13, wherein a plurality of first upper guard dams are provided, the first upper guard dams are formed to cover the upper extension dams, respectively.

16. The method according to claim 13, further comprising:
after forming the upper interlayer insulating layer,
forming at least one lower extension dam passing through the upper interlayer insulating layer and surrounding the fuse region.

17. The method according to claim 16, further comprising:
after forming the lower interlayer insulating layer,
forming a first lower guard dam surrounding the fuse region on the lower interlayer insulating layer.

18. The method according to claim 17, further comprising:
after forming the first lower guard dam,
forming an intermediate interlayer insulating layer on the substrate having the first lower guard dam;
forming at least one plug guard dam passing through the intermediate interlayer insulating layer and contacting the first lower guard dam, the plug guard dam being formed to surround the fuse region; and
forming a second lower guard dam on the intermediate interlayer insulating layer to cover the lower plug guard dam.

19. The method according to claim 13, wherein forming the fuse guard dam comprises:
forming a fuse metal layer on the upper interlayer insulating layer; and
patterning the fuse metal layer.

20. The method according to claim 19, further comprising:
before forming the fuse metal layer,
forming a barrier layer on the upper interlayer insulating layer, the barrier layer being patterned by a semiconductor process of patterning the fuse metal layer and thus left under the fuse guard dam.

21. The method according to claim 19, further comprising:
after forming the fuse metal layer, forming a capping layer on the fuse metal layer, the capping layer being patterned by a semiconductor process of patterning the fuse metal layer and thus left over the fuse guard dam.

* * * * *